(12) United States Patent
Ebisawa et al.

(10) Patent No.: US 7,049,011 B2
(45) Date of Patent: May 23, 2006

(54) ORGANIC ELECTROLUMINESCENT DEVICE

(75) Inventors: Akira Ebisawa, Tokyo (JP); Masahiro Shinkai, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/387,453

(22) Filed: Mar. 14, 2003

(65) Prior Publication Data
US 2004/0048100 A1 Mar. 11, 2004

(30) Foreign Application Priority Data
Mar. 14, 2002 (JP) .............................. 2002-070125

(51) Int. Cl.
*H01L 51/50* (2006.01)
*H05B 33/14* (2006.01)

(52) U.S. Cl. ...................... 428/690; 428/917; 313/504; 257/40

(58) Field of Classification Search ................ 428/690, 428/917; 313/504; 257/40
See application file for complete search history.

(56) References Cited

U.S. PATENT DOCUMENTS 6,686,066 B1 * 2/2004 Kwon et al. ................ 428/690
2001/0026879 A1 * 10/2001 Chen et al. ................. 428/690

FOREIGN PATENT DOCUMENTS

| JP | 08-012600 | 1/1996 |
|---|---|---|
| JP | 10-092576 | 4/1998 |

OTHER PUBLICATIONS

Marsitzky, et al., "Controlled Radical Polymerization of Electroluminescent Vinyl Derivatives", Polymer Preprints, (2001), vol. 42, No. 1, pp. 468-469.*
JP 08-12600 Abstract (published Jan. 16, 1996) and machine translation from Japanese Patent Office website (www4.ipdl.ncipi.go.jp).*
C. W. Tang, et al., Appl. Phys. Lett., vol. 51,, No. 12, pp. 913-915, "Organic Electroluminescent Diodes", Sep. 1987.
R. H. Partridge, Polymer, vol. 24, pp. 748-754, "Electroluminescence From Polyvinylcarbazole Films: 3. Electroluminescent Devices", Jun. 1983.
J. Kido, et al., Polymer Reprints, vol. 45, No. 3, p. 446, "Synthesis of Copolymer Containing Carbazole and Oxadiazole Units and its Application to Organic Electroluminescent Device", 1996.
J. Kido, et al., Chemistry Letters, pp. 161-162, "Electroluminescent Poly(Arylene Ether) Containing Both Hole-Transporting and Electron-Transporting Units", 1996.
S. Shirai, et al., Polymer Reprints, vol. 50, No. 4, p. 661, "Synthesis of Vinyl Polymers Containing Phenyl Anthracene Pendants and Their Application to Organic EL Devices", 2001.
S. Shirai, et al., Chemistry Letters, No. 3, pp. 386-387, "Synthesis of Vinyl Polymers Containing Phenylanthracene Pendants and Their Application to Organic EL Device", 2002.

* cited by examiner

*Primary Examiner*—Dawn L. Garrett
(74) *Attorney, Agent, or Firm*—Oblon, Spivak, McClelland, Maier & Neustadt, P.C.

(57) ABSTRACT

A vinyl polymer having a 9,10-substituted anthracene structure which is a stable structure with a high solid quantum efficiency is obtained from a vinyl monomer having a group derived from the structure of formula (1) wherein $n_1$ is an integer of 1 to 3, each of $X_1$, $X_2$, $X_3$ and $X_4$ is a substituent group, $k_1$ and $k_4$ are integers of 0 to 5, and $k_2$ and $k_3$ are integers of 0 to 4. An organic EL device comprising an organic layer containing the vinyl polymer becomes a molecule dispersed type organic EL device featuring a high efficiency and a long life.

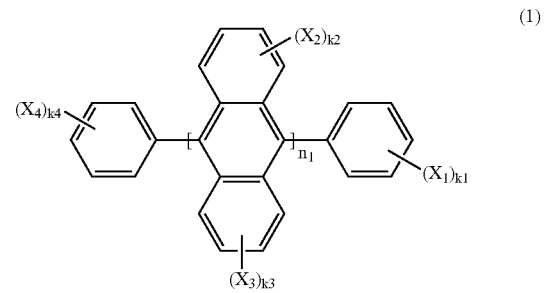

13 Claims, No Drawings

ORGANIC ELECTROLUMINESCENT DEVICE

BACKGROUND OF THE INVENTION

1. Technical Field

This invention relates to an organic electroluminescent (EL) device using a polymer, and more particularly, to a molecule dispersed polymer type organic EL device using a vinyl polymer.

2. Background Art

Multilayer structure organic EL devices using low molecular weight compounds obtained by a vacuum evaporation process (as described in, for example, Appl. Phys. Lett., 51, p 913 (1987)) are now on the verge of commercialization as a result of consecutive fabrication of devices on a practically acceptable level. A number of structures have been proposed for the low molecular weight compounds. It was proposed, for example, in JP-A 8-12600 that a blue light emitting device having high efficiency is established using a 9,10-diphenylanthracene derivative with a high solid quantum yield as a host material in a light emitting layer, with the proposal becoming of great interest.

On the other hand, active efforts have been made on the development of organic EL devices using high molecular weight compounds or polymers. The use of polymers is expected to overcome the thermal stability problem which arises with the low molecular weight compounds obtained by an evaporation process and to simplify the manufacturing process because of possible coating. Polymeric organic EL devices can be generally divided into π-conjugated type using conjugated polymers and molecule dispersed type having dyes dispersed in unconjugated polymers.

With regard to the π-conjugated type device, since its disclosure (as described in JP-A 10-92576, for example), the development of polymeric organic EL devices fabricated by coating polymers has been accelerated. Lamination with an excellent hole-injecting polymer such as polyethylenedioxythiophene/polystyrene sulfonic acid (PEDOT/PSS) has provided a device having characteristics comparable to the device relying on the evaporation process.

However, the use of π-conjugated polymers has the problem that the spreading of π-conjugated system renders it awkward to make a material emitting blue light of a good color purity. No material exhibiting a color purity and lifetime both within the practically acceptable region is available at present.

The molecule dispersed type was announced earlier than the π-conjugated type (see, for example, Polymer, Vol. 24, 748–754, 1983). By mixing in a host polymer a dopant commonly used in the evaporation type, blue light of good color purity is readily obtained. However, as compared with the low molecular weight compound evaporation type and the π-conjugated type, the molecule dispersed type suffers from a serious delay with respect to properties, especially lifetime.

The cause is the difficulty of polymer synthesis, and only a few compounds have been evaluated. The polymers which have been used in the molecule dispersed type include polyvinyl carbazole (PVK) and only a few reported so far (see, for example, Kido et al., Polymer Preprints, Japan, 45, No. 3, 446 (1996), Kido et al., Chem. Lett., 161 (1996)). Vinyl polymers having an anthracene structure have also been reported, but with extremely poor properties (see, for example, Kido et al., Polymer Preprints, Japan, 50, No. 4, 661 (2001)). The vinyl polymers reported therein include a homopolymer obtained from 9-(4-vinylphenyl)anthracene in the form of a 9- or 10-substituted anthracene structure and copolymers obtained from 9-(4-vinylphenyl)anthracene and N-vinylcarbazole.

SUMMARY OF THE INVENTION

One embodiment of the present invention is an organic EL device comprising an organic layer containing a vinyl polymer obtained from a vinyl monomer having a group derived from the structure of formula (1).

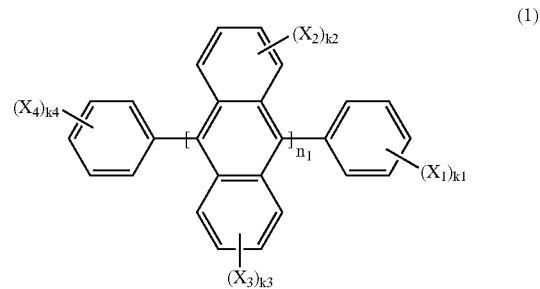

In formula (1), $n_1$ is an integer of 1 to 3, each of $X_1$, $X_2$, $X_3$ and $X_4$ is a substituent group, $k_1$ and $k_4$ are integers of 0 to 5, and $k_2$ and $k_3$ are integers of 0 to 4.

Preferably in formula (1), at least one of $X_1$, $X_2$, $X_3$ and $X_4$ is a substituent group having an alkyl group of 3 to 20 carbon atoms in total, and at least one substituent group having an alkyl group of 3 to 20 carbon atoms in total is present.

The vinyl monomer preferably has formula (2).

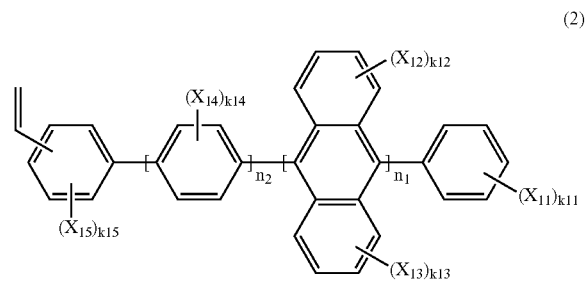

In formula (2), $n_1$ is an integer of 1 to 3, $n_2$ is 0 or 1, each of $X_{11}$, $X_{12}$, $X_{13}$, $X_{14}$ and $X_{15}$ is an alkyl group, alkoxy group, aryl group, aryloxy group, heterocyclic group, halogen atom, cyano group, hydroxyl group or amino group, $k_{11}$ is an integer of 0 to 5, and each of $k_{12}$, $k_{13}$, $k_{14}$ and $k_{15}$ is an integer of 0 to 4.

Preferably in formula (2), at least one of $X_{11}$, $X_{12}$, $X_{13}$, $X_{14}$ and $X_{15}$ is a substituent group having an alkyl group of 3 to 20 carbon atoms in total, and at least one substituent group having an alkyl group of 3 to 20 carbon atoms in total is present.

The preferred vinyl polymer is a copolymer obtained from the vinyl monomer and another vinyl monomer.

Preferably the vinyl monomer has been synthesized according to the reaction scheme represented by formula (R-1) or (R-2).

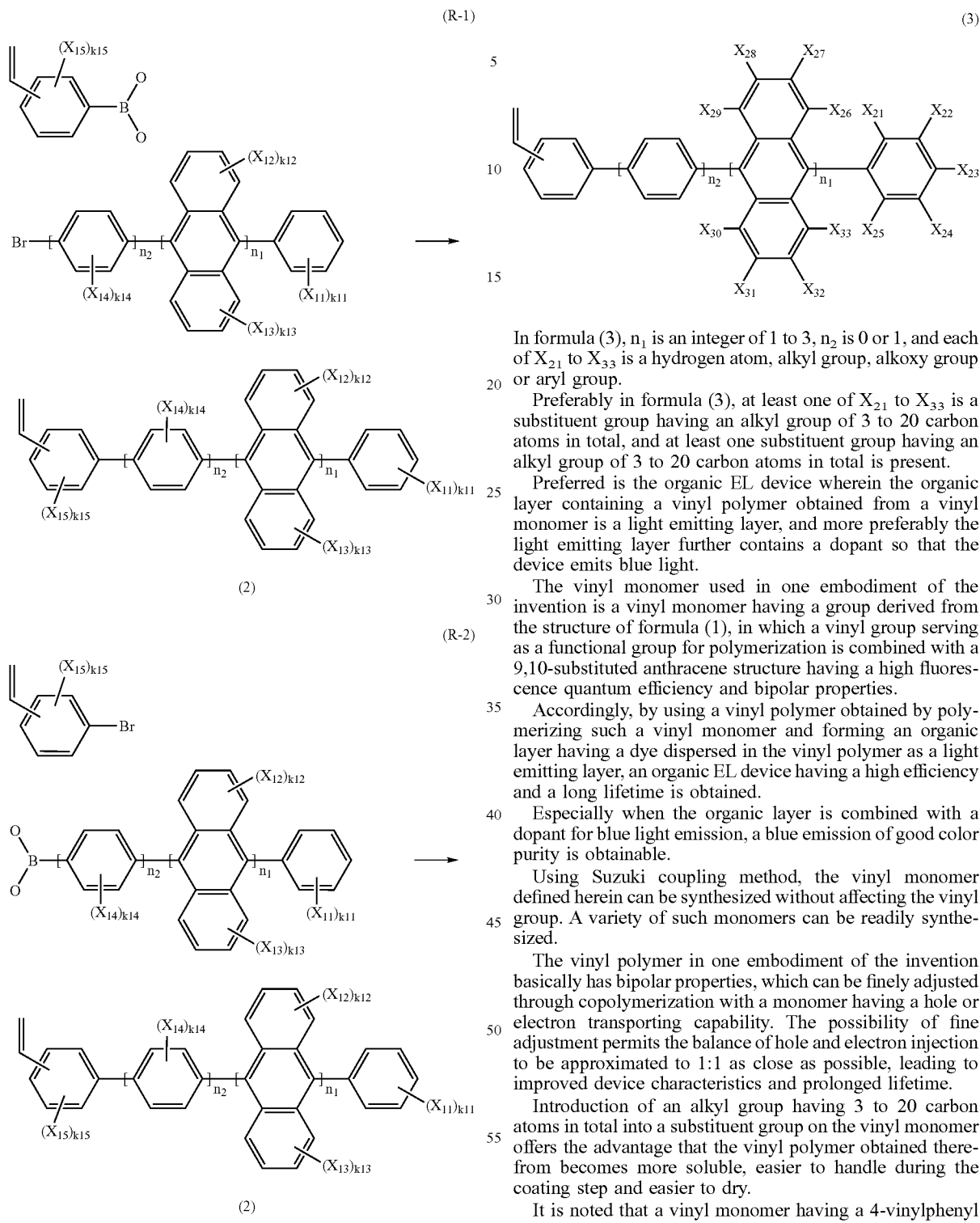

More preferably, the vinyl monomer has formula (3).

In formula (3), $n_1$ is an integer of 1 to 3, $n_2$ is 0 or 1, and each of $X_{21}$ to $X_{33}$ is a hydrogen atom, alkyl group, alkoxy group or aryl group.

Preferably in formula (3), at least one of $X_{21}$ to $X_{33}$ is a substituent group having an alkyl group of 3 to 20 carbon atoms in total, and at least one substituent group having an alkyl group of 3 to 20 carbon atoms in total is present.

Preferred is the organic EL device wherein the organic layer containing a vinyl polymer obtained from a vinyl monomer is a light emitting layer, and more preferably the light emitting layer further contains a dopant so that the device emits blue light.

The vinyl monomer used in one embodiment of the invention is a vinyl monomer having a group derived from the structure of formula (1), in which a vinyl group serving as a functional group for polymerization is combined with a 9,10-substituted anthracene structure having a high fluorescence quantum efficiency and bipolar properties.

Accordingly, by using a vinyl polymer obtained by polymerizing such a vinyl monomer and forming an organic layer having a dye dispersed in the vinyl polymer as a light emitting layer, an organic EL device having a high efficiency and a long lifetime is obtained.

Especially when the organic layer is combined with a dopant for blue light emission, a blue emission of good color purity is obtainable.

Using Suzuki coupling method, the vinyl monomer defined herein can be synthesized without affecting the vinyl group. A variety of such monomers can be readily synthesized.

The vinyl polymer in one embodiment of the invention basically has bipolar properties, which can be finely adjusted through copolymerization with a monomer having a hole or electron transporting capability. The possibility of fine adjustment permits the balance of hole and electron injection to be approximated to 1:1 as close as possible, leading to improved device characteristics and prolonged lifetime.

Introduction of an alkyl group having 3 to 20 carbon atoms in total into a substituent group on the vinyl monomer offers the advantage that the vinyl polymer obtained therefrom becomes more soluble, easier to handle during the coating step and easier to dry.

It is noted that a vinyl monomer having a 4-vinylphenyl group introduced into anthracene at either 9- or 10-position is described in Polymer Preprints, Japan, 50, No. 4, 661 (2001) as discussed previously. A homopolymer obtained from this vinyl monomer and copolymers obtained from this vinyl monomer and N-vinylcarbazole are reported. It is also described that blue light emission is produced when the monomer compositional ratio of the copolymer is restricted to a specific range. However, the anthracene structure described in this reference, which has a substituent group In formulae (R-1) and (R-2), $n_1$ is an integer of 1 to 3, $n_2$ is 0 or 1, each of $X_{11}$, $X_{12}$, $X_{13}$, $X_{14}$ and $X_{15}$ is an alkyl group, alkoxy group, aryl group, aryloxy group, heterocyclic group, halogen atom, cyano group, hydroxyl group or amino group, $k_{11}$ is an integer of 0 to 5, and each of $k_{12}$, $k_{13}$, $k_{14}$ and $k_{15}$ is an integer of 0 to 4.

introduced at either one of 9- and 10-positions, differs from the structure in the embodiment of the present invention. The device of this reference exhibits poor properties for the probable reason that since the 9- and 10-positions of anthracene structure are active sites, the structure becomes extremely unstable absent substituent groups at both the positions.

DESCRIPTION OF THE PREFERRED EMBODIMENTS

Several embodiments of the present invention are described below in detail.

The organic EL device according to one embodiment of the invention has a hole injecting electrode (or anode), an electron injecting electrode (or cathode), and an organic layer between the electrodes containing a vinyl polymer obtained from a vinyl monomer having a group derived from the structure of formula (1).

Formula (1) is described.

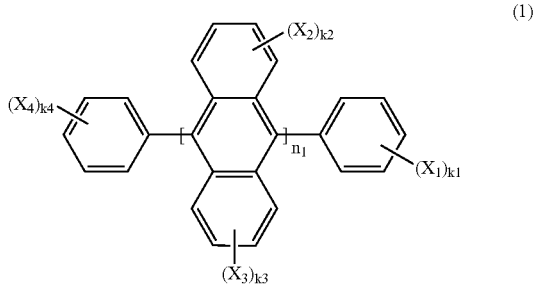

(1)

In formula (1), $n_1$ is an integer of 1 to 3. Each of $X_1$ to $X_4$ is a substituent group. Each of $k_1$ and $k_4$ is an integer of 0 to 5. Each of $k_2$ and $k_3$ is an integer of 0 to 4.

The subscript $n_1$ is an integer of 1 to 3, preferably 1 or 2.

The substituent group represented by $X_1$ to $X_4$ is selected from among alkyl groups, alkoxy groups, aryl groups, aryloxy groups, heterocyclic groups, halogen atoms, cyano groups, hydroxyl groups, amino groups and the like. Often alkyl, alkoxy and aryl groups are preferred, with alkyl and aryl groups being especially preferred.

The alkyl groups represented by $X_1$ to $X_4$ may be straight or branched and may be substituted although unsubstituted groups are preferred. The total number of carbon atoms is preferably 1 to 20. Examples include methyl, ethyl, n-propyl, isopropyl, n-butyl, isobutyl, s-butyl, t-butyl, pentyl, hexyl, octyl, 2-ethylhexyl, dodecyl, tetradecyl, and hexadecyl.

The alkyl groups represented by $X_1$ to $X_4$ should preferably have 3 to 20 carbon atoms in total in establishing the advantage that a vinyl polymer obtained from a corresponding monomer becomes more soluble in a coating solvent, easier to handle during the coating step and easier to dry.

The alkoxy groups represented by $X_1$ to $X_4$ are preferably those groups whose alkyl moiety is the same as the alkyl groups represented by $X_1$ to $X_4$. Examples include methoxy, ethoxy, propoxy, isopropoxy, butoxy, isobutoxy, s-butoxy, t-butoxy, 2-ethylhexyloxy, octyloxy, dodecyloxy, tetradecyloxy and hexadecyloxy.

From the standpoints of improved solubility and concomitant advantages discussed above in conjunction with the alkyl groups, the alkyl moiety of the alkoxy group should preferably have 3 to 20 carbon atoms in total.

The aryl groups represented by $X_1$ to $X_4$ may be unsubstituted or have a substituent group, and the total number of carbon atoms is preferably 6 to 40. Examples include phenyl, o-, m- and p-tolyl, and biphenylyl. From the standpoints of improved solubility and concomitant advantages discussed above, it is preferred to introduce an alkyl group having 3 to 20 carbon atoms in total into the substituent group.

The aryloxy groups represented by $X_1$ to $X_4$ are preferably those groups whose aryl moiety is the same as the aryl groups represented by $X_1$ to $X_4$. Examples include phenoxy and o-, m- and p-tolyloxy. From the standpoints of improved solubility and concomitant advantages discussed above, it is preferred to introduce an alkyl group having 3 to 20 carbon atoms in total into the substituent group.

The heterocyclic groups represented by $X_1$ to $X_4$ include 5- or 6-membered heterocyclic groups which may have a fused ring, may also have a substituent group, and may have or have not aromatic nature. Examples include pyrrolyl, pyridyl, quinolyl, thienyl and furyl. From the standpoints of improved solubility and concomitant advantages discussed above, it is preferred to introduce an alkyl group having 3 to 20 carbon atoms in total into the substituent group.

The halogen atoms represented by $X_1$ to $X_4$ include fluorine, chlorine, bromine, iodine and the like.

The amino groups represented by $X_1$ to $X_4$ may be unsubstituted or have a substituent group which may have an alkyl or aryl group as described above, and the total number of carbon atoms is preferably 0 to 20. Examples include amino, methylamino, ethylamino, phenylamino, dimethylamino, and diphenylamino. From the standpoints of improved solubility and concomitant advantages discussed above, it is preferred that the alkyl group to be introduced into the substituent group (e.g., alkyl or aryl group) on the amino group have 3 to 20 carbon atoms in total.

From the standpoints of improved solubility and concomitant advantages discussed above, it is preferred that an alkyl group having 3 to 20 carbon atoms in total be introduced into at least one of the substituent groups represented by $X_1$ to $X_4$. Most often, at least one of the substituent groups represented by $X_1$ to $X_4$ is an alkyl or alkoxy group having 3 to 20 carbon atoms in total.

In formula (1), $k_1$ to $k_4$ each are preferably 0, 1 or 2, and especially 0 or 1.

It is noted that each of $k_1$ to $k_4$ equal to 0 means that each benzene ring is unsubstituted, with hydrogen atoms being attached to all the substitutable positions. Analogous denotation below has the same meaning. From the standpoints of improved solubility and concomitant advantages discussed above, it is preferred that at least one substituent group having an alkyl group of 3 to 20 carbon atoms in total be present in the vinyl monomer.

Of the vinyl monomers having a group derived from the structure of formula (1), vinyl monomers having formula (2) are preferred.

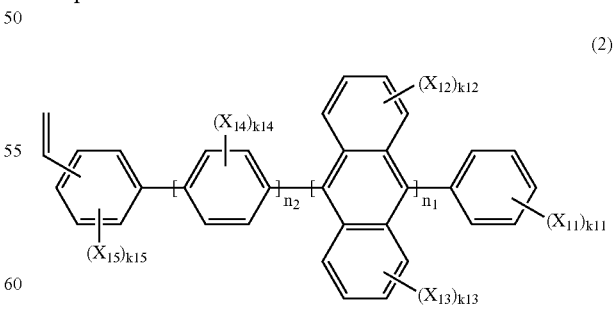

(2)

In formula (2), $n_1$ is an integer of 1 to 3, and $n_2$ is 0 or 1. Each of $X_{11}$ to $X_{15}$ is an alkyl group, alkoxy group, aryl group, aryloxy group, heterocyclic group, halogen atom, cyano group, hydroxyl group or amino group. The subscript $k_{11}$ is an integer of 0 to 5, and each of $k_{12}$ to $k_{15}$ is an integer of 0 to 4.

The subscript $n_1$ is an integer of 1 to 3, and preferably 1 or 2.

The subscript $n_2$ is 0 or 1, and preferably 0.

The alkyl group, alkoxy group, aryl group, aryloxy group, heterocyclic group, halogen atom, and amino group represented by $X_{11}$ to $X_{15}$ are the same as those represented by $X_1$ to $X_4$ in formula (1), with their preferred examples being the same. Also the same discussion is applicable with respect to the use of an alkyl group having 3 to 20 carbon atoms in total and the introduction of such an alkyl group into the substituent group for achieving the advantages of improved solubility and the like. Most often, $X_{11}$ to $X_{13}$, especially $X_{11}$, are alkyl or alkoxy groups having 3 to 20 carbon atoms in total, especially for achieving the advantages of improved solubility and the like.

$X_{11}$ to $X_{15}$ are preferably alkyl, alkoxy and aryl groups, with alkyl and aryl groups being especially preferred.

The subscript $k_{11}$ is preferably 0, 1 or 2, $k_{12}$ and $k_{13}$ are preferably 0 or 1, more preferably $k_{12}+k_{13}$ is 0 or 1, and $k_{14}$ and $k_{15}$ are preferably 0.

Of the vinyl monomers having formula (2), vinyl monomers having formula (3) are preferred.

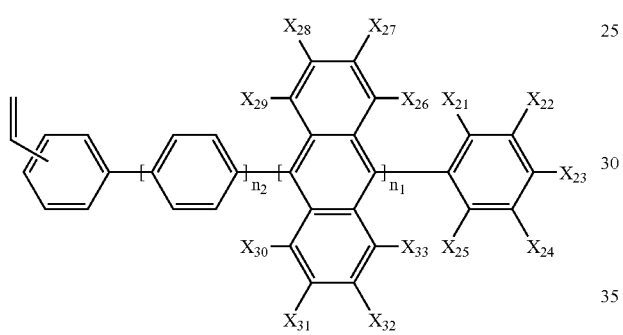

(3)

In formula (3), $n_1$ is an integer of 1 to 3, and $n_2$ is 0 or 1.

Each of $X_{21}$ to $X_{33}$ is a hydrogen atom, alkyl group, alkoxy group or aryl group.

The subscript $n_1$ is an integer of 1 to 3, and preferably 1 or 2.

The subscript $n_2$ is 0 or 1, and preferably 0.

The alkyl group, alkoxy group and aryl group represented by $X_{21}$ to $X_{33}$ are the same as those represented by $X_1$ to $X_4$ in formula (1), with their preferred examples being the same. Also the same discussion is applicable with respect to the use of an alkyl group having 3 to 20 carbon atoms in total and the introduction of such an alkyl group into the substituent group for achieving the advantages of improved solubility and the like. Most often, $X_{23}$, $X_{27}$, or $X_{32}$, especially $X_{23}$, is an alkyl or alkoxy group having 3 to 20 carbon atoms in total, especially for achieving the advantages of improved solubility and the like.

$X_{21}$ to $X_{33}$ are preferably hydrogen atoms, alkyl groups and aryl groups.

Illustrative examples of the vinyl monomers are given below although the embodiment of the invention is not limited thereto.

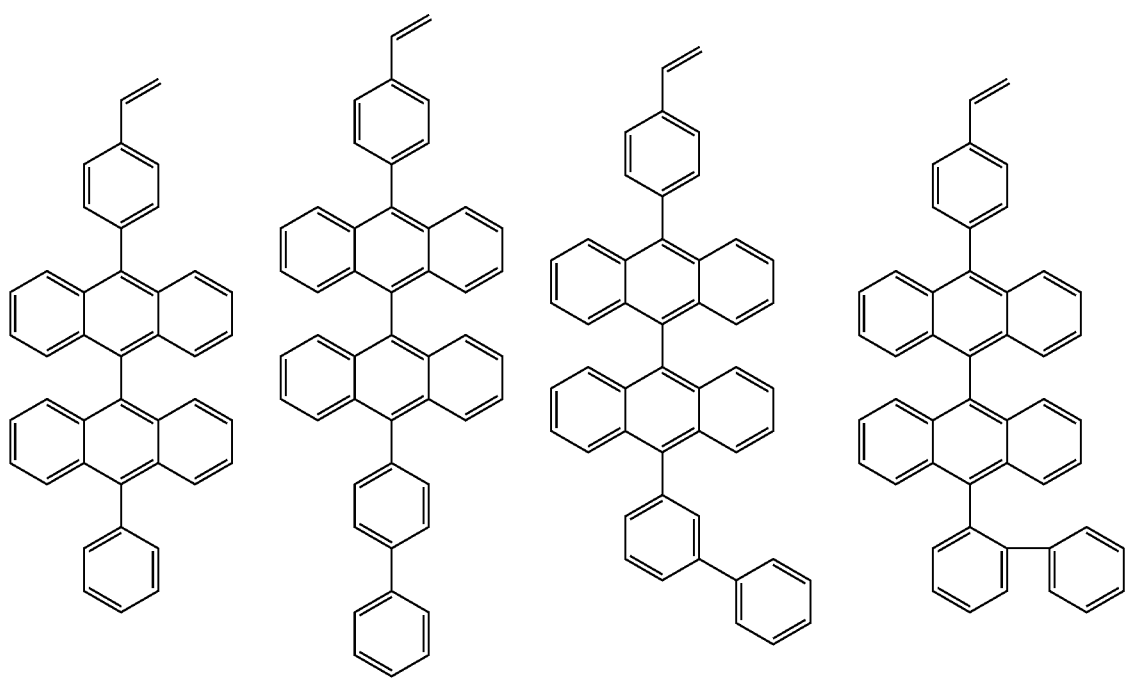

-continued
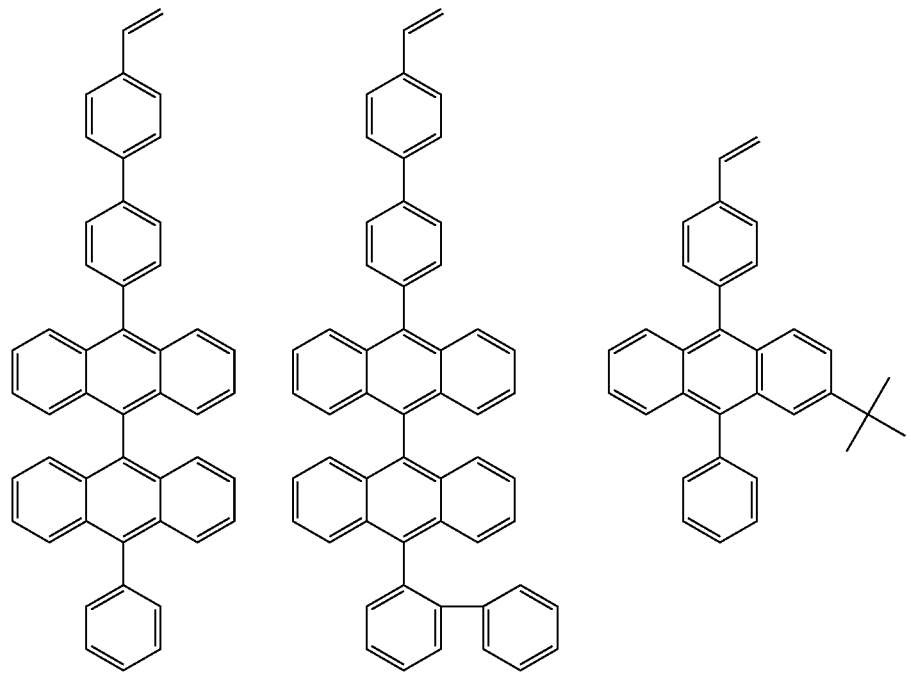
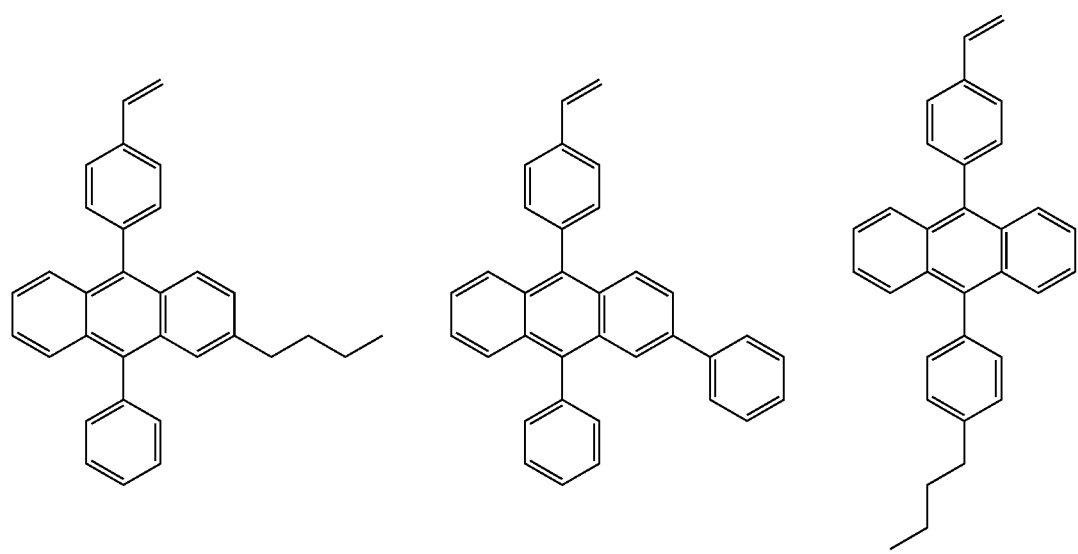

-continued
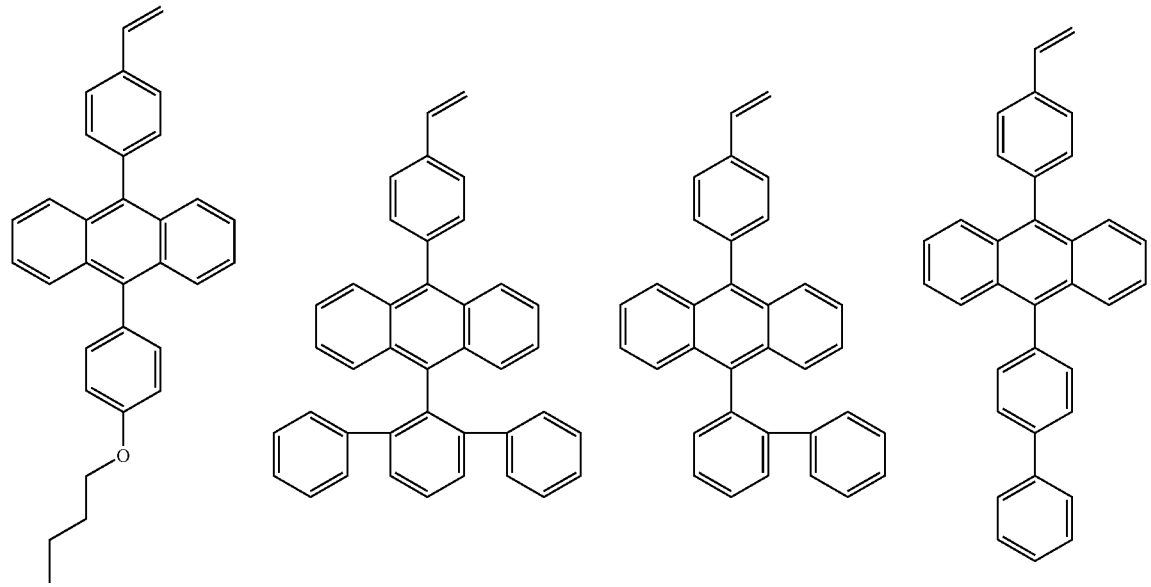
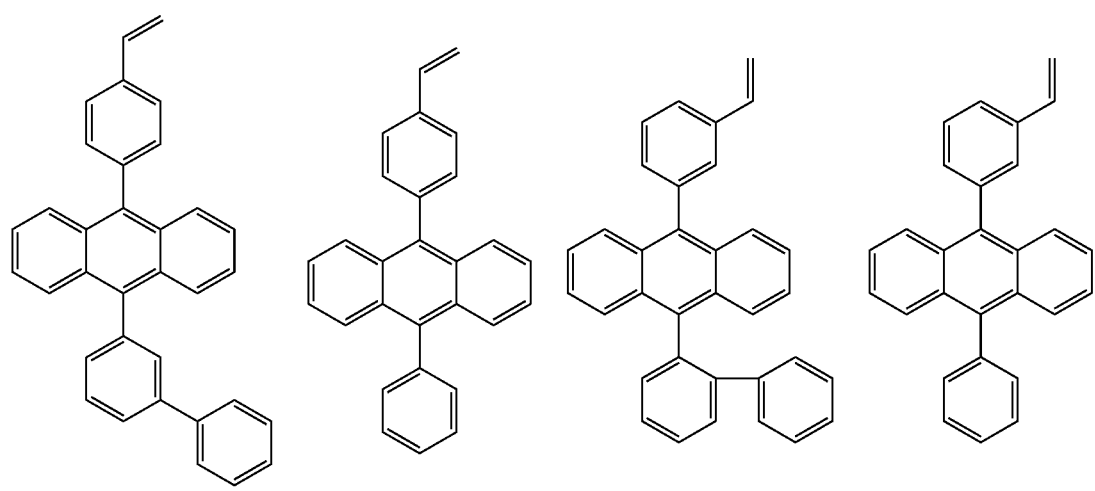

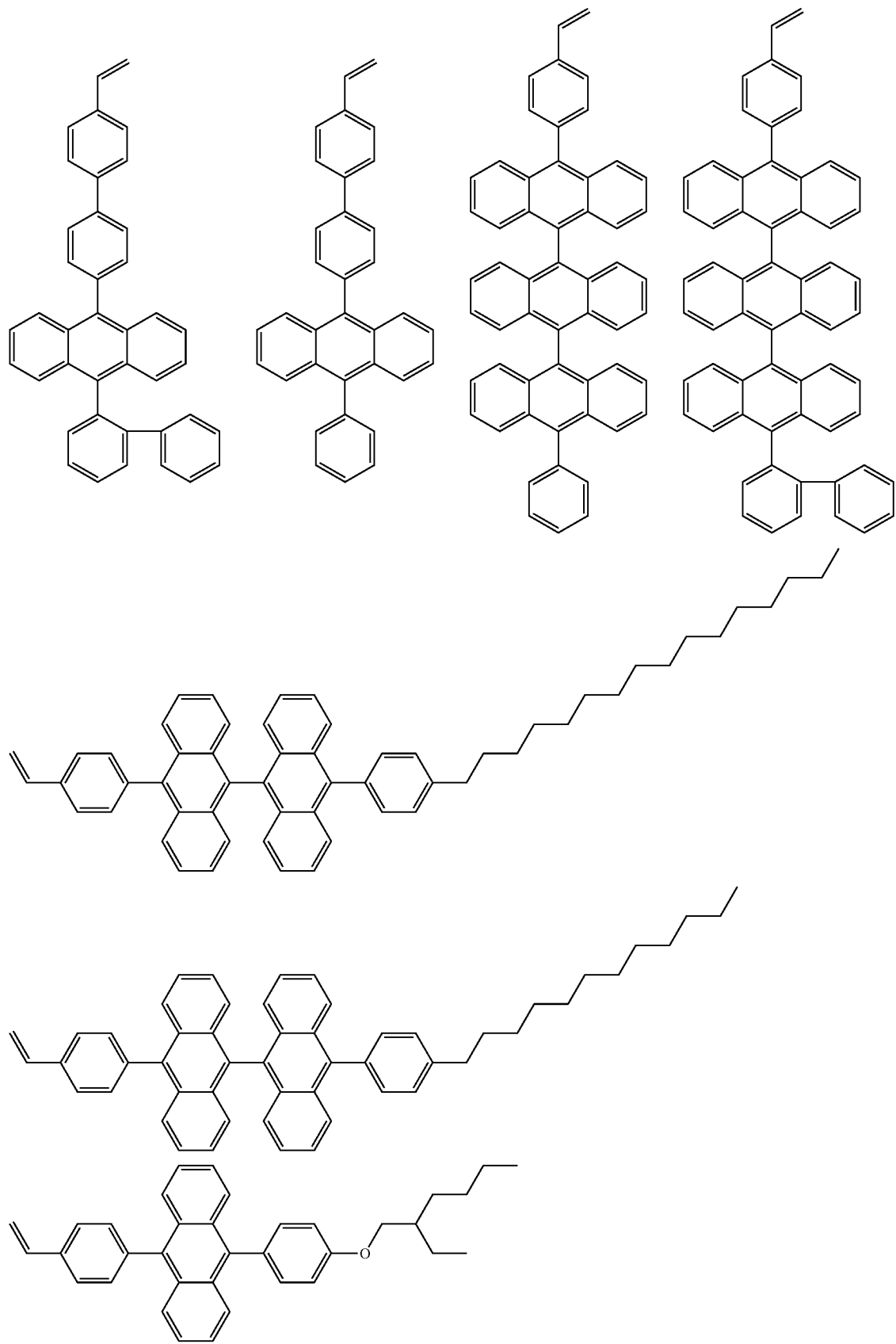

-continued
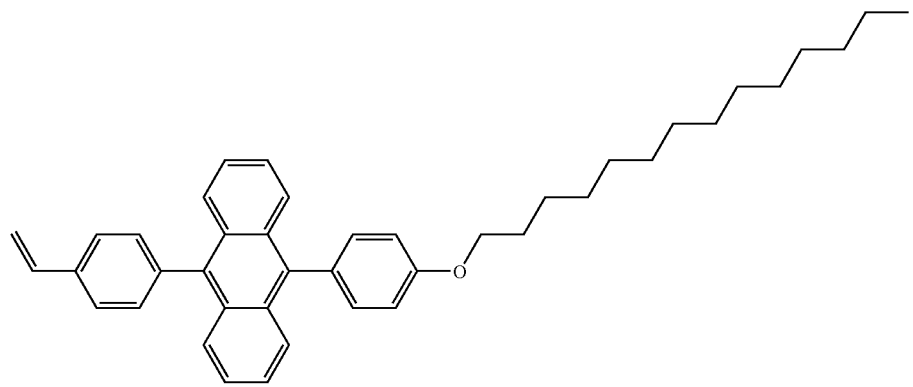
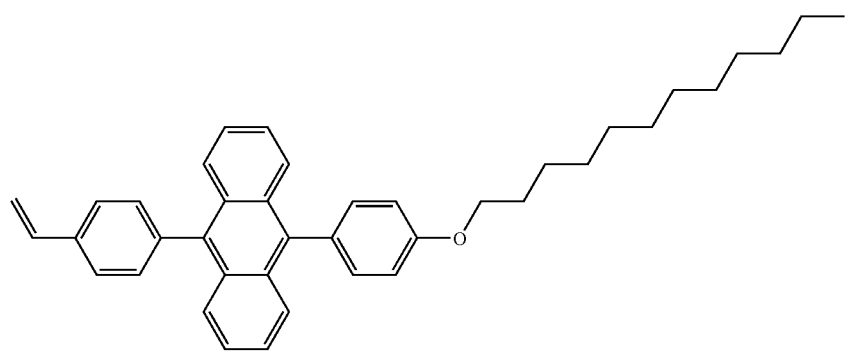
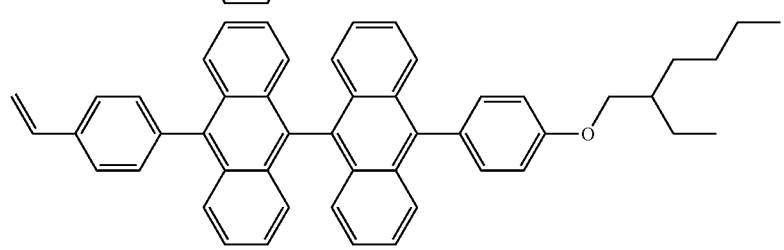
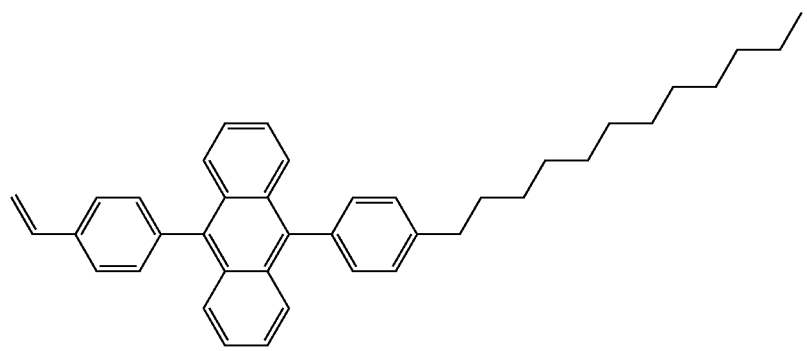
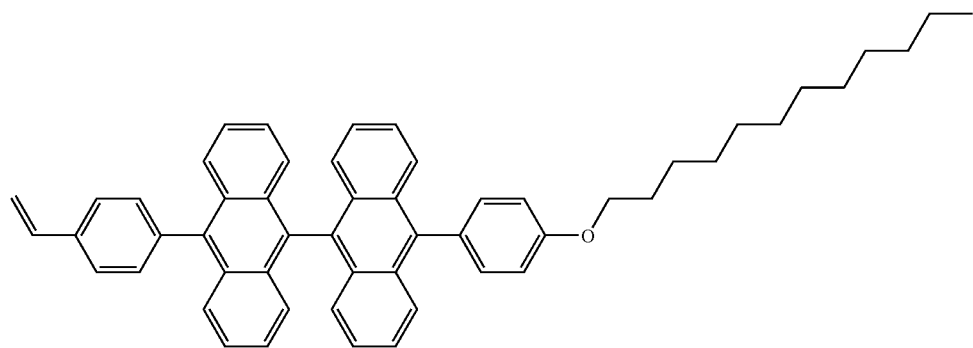

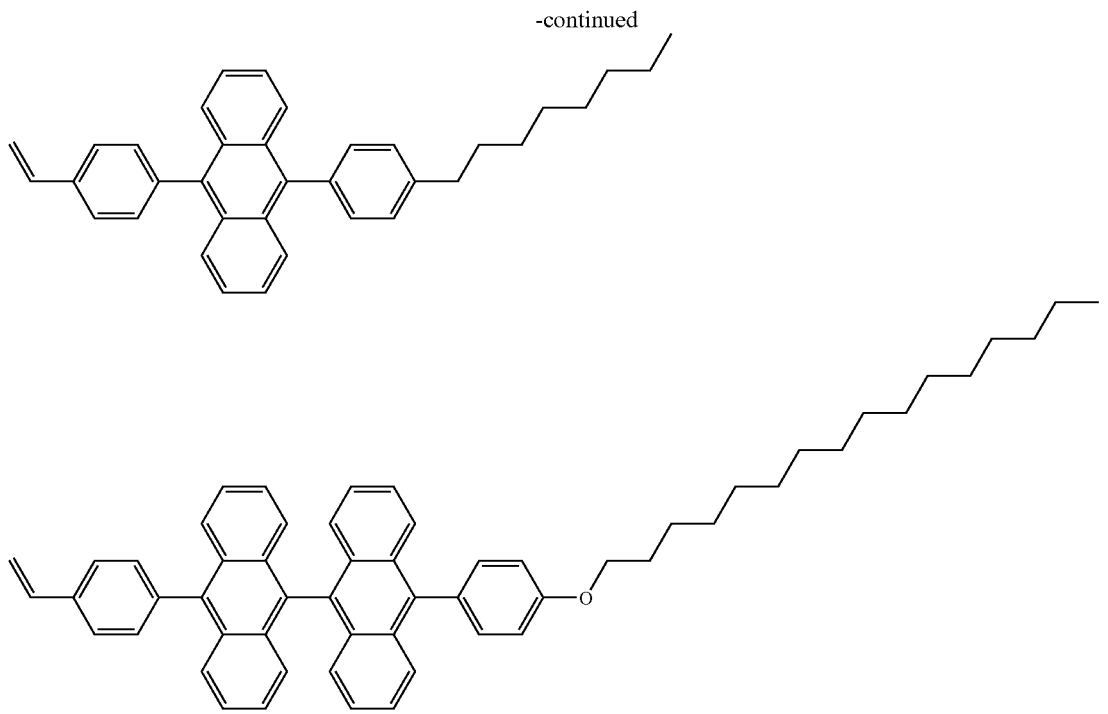

The vinyl monomers described above can be synthesized by Suzuki coupling reaction using a selected vinylphenyl boronic acid and a selected 9-phenylanthracene bromide, or a selected vinylphenyl bromide and a selected 9-phenylanthracene boronic acid.

This synthesis scheme is represented by the following formulae (R-1) and (R-2) when reference is made to the vinyl monomer of formula (2).

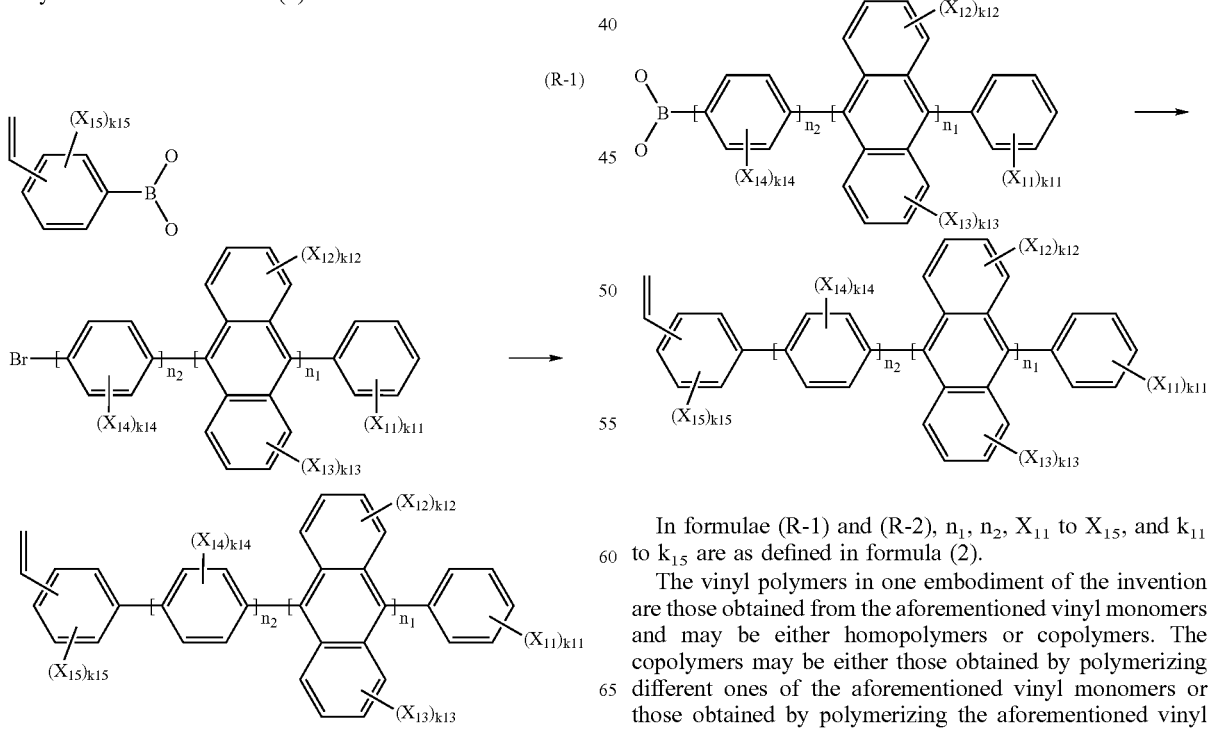

In formulae (R-1) and (R-2), $n_1$, $n_2$, $X_{11}$ to $X_{15}$, and $k_{11}$ to $k_{15}$ are as defined in formula (2).

The vinyl polymers in one embodiment of the invention are those obtained from the aforementioned vinyl monomers and may be either homopolymers or copolymers. The copolymers may be either those obtained by polymerizing different ones of the aforementioned vinyl monomers or those obtained by polymerizing the aforementioned vinyl monomer with another vinyl monomer. For the above-discussed purposes of improving solubility and the like, it is preferred that the proportion of a vinyl monomer having an alkyl group of 3 to 20 carbon atoms in total introduced therein be at least 20 mol % based on the entire monomers.

The other vinyl monomer may be selected in accordance with the purpose or the like. For the enhancement of an electron transporting capability, for example, 4-vinylpyridine, 2-vinylpyridine, and 1-vinylimidazole, shown below, or the like can be used.

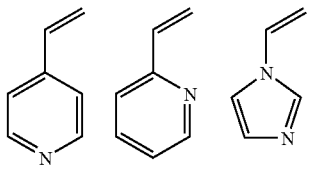

For the enhancement of a hole transporting capability, N-vinylcarbazole and (4-vinylphenyl)-diphenylamine, shown below, or the like can be used.

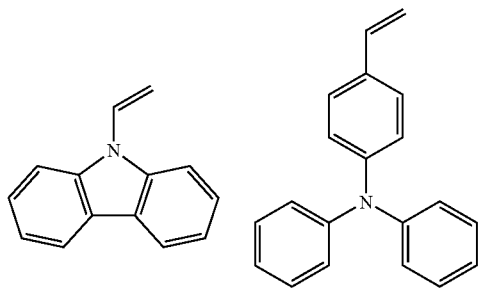

The proportion of a monomer having a hole or electron transporting capability is not critical although it is usually about 1 to 30 mol %, preferably about 1 to 20 mol % based on the entire monomers. Such a proportion is set because the high fluorescence quantum yield and other excellent properties the vinyl monomer in one embodiment of the invention possesses can be advantageously exerted, and because the vinyl monomer of the invention itself having bipolar properties permits an optimum charge injection balance to be achieved with not more than 30 mol % of the additional monomer.

With respect to the molecular weight of the vinyl polymer in one embodiment of the invention, the weight average molecular weight is preferably about 10,000 to about 100,000.

The vinyl polymer in one embodiment of the invention can be readily synthesized using the inventive vinyl monomer and optionally, another vinyl monomer, and by any well-known polymerization technique such as radical polymerization, cation polymerization or anion polymerization technique.

The vinyl polymer in one embodiment of the invention may be used in devices of the type wherein an organic layer is formed by coating, and preferably in devices of the molecule dispersed type as the host material of a light emitting layer. Most preferably, the vinyl polymer is used in a light emitting layer for blue light emission. Examples of the dopant for blue light emission used in combination with the host in this embodiment include tetraphenylbutadiene and derivatives thereof, styrylamine derivatives, and fluoranthene derivatives, with tetraphenylbutadiene and analogues are preferred. An appropriate proportion of the dopant is about 1 to about 15% by weight based on the monomer units of one embodiment of the invention in the vinyl polymer.

Besides, the vinyl polymer in one embodiment of the invention may be advantageously used in an electron transporting layer as well.

Now discussion is made on the use of the vinyl polymer in one embodiment of the invention in a blue light emitting layer.

In one embodiment of the invention, organic materials that make up the organic layer together with the vinyl polymer and the blue light emitting dopant include light emitting materials and charge transporting materials (inclusive of both electron transporting materials and hole transporting materials) commonly used in organic EL devices. Instead of the electron injecting and/or transporting layer and the hole injecting and/or transporting layer, the device may have an electron injecting and/or transporting layer and a hole injecting and/or transporting layer, both made of a high resistance inorganic material.

Polymers are used mainly as the light emitting material and hole transporting material, and examples thereof include polyethylenedioxythiophene/polystyrene sulfonate (PEDOT/PSS), polyvinyl carbazole (PVK), polyaniline/polystyrene sulfonate (Pani/PSS), poly-p-phenylenevinylene derivatives (PPV derivatives) of formula (P-1) below, and polyarylfluorene derivatives of formula (P-2) below, alone or in admixture thereof.

The molecular weight of these polymers is at least about 5,000, typically about 5,000 to about 3,000,000 as expressed by weight average molecular weight Mw.

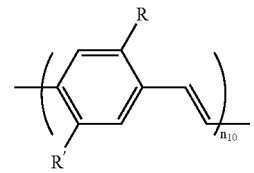

(R is a 2-ethylhexyloxy group, R' is a methoxy group, $n_{10}$ represents a degree of polymerization, and Mw is 50,000.)

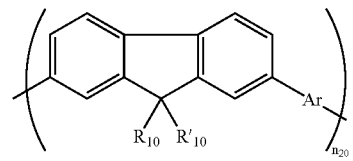

($R_{10}$ and $R_{10}'$ each are an alkyl group, Ar is an aromatic ring group or heterocyclic group which may be substituted, $n_{20}$ represents a degree of polymerization, and Mw is 5,000–3,000,000.)

The charge transporting material used in one embodiment of the invention is not critical and may be selected from a variety of electron transporting materials and hole transporting materials.

Suitable hole transporting materials include pyrazoline derivatives, arylamine derivatives, stilbene derivatives, and triphenyldiamine derivatives.

Suitable electron transporting materials include oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorene and derivatives thereof, diphenyldicyanoethylene and derivatives thereof, diphenoquinone derivatives, 8-hydroxyquinoline and derivatives thereof, phenanthroline and derivatives thereof, and metal complexes having these compounds as ligands.

Illustrative examples are those described in JP-A 63-70257, JP-A 63-175860, JP-A 2-135359, JP-A 2-209988, JP-A 3-37992, and JP-A 3-152184.

It is noted that when a thin film is formed by a coating technique, heating and drying is desirably carried out in vacuum or an inert atmosphere at a temperature of 30 to 200° C., preferably 60 to 100° C. for removing the solvent.

The thickness of the organic light emitting layer and hole injecting/transporting layer and the thickness of the electron injecting/transporting layer are not critical and vary with a particular forming method. The thickness is generally about 5 to 500 nm, and especially about 10 to 300 nm. When a hole injecting layer and a hole transporting layer are formed, it is preferred that the injecting layer have a thickness of at least 0.1 nm and the transporting layer have a thickness of at least 1 nm. The upper limit of thickness of these layers is generally about 50 nm for the injecting layer and about 500 nm for the transporting layer.

The solvent used in forming the organic layer by the coating method in one embodiment of the invention is not critical as long as the organic material is dissolvable therein and no troubles occur upon coating. Exemplary solvents include alcohol, hydrocarbon, ketone, and ether solvents which are commonly used in this type of application. Among others, chloroform, methylene chloride, dichloroethane, tetrahydrofuran, toluene, xylene, cyclohexanone, dimethylformamide and N-methylpyrrolidone are preferred. The polymer may be generally dissolved in such a solvent in a concentration of at least 0.1% by weight although the concentration depends on the structure and molecular weight of the polymer.

The cathode or electron injecting electrode need not have a low work function and an electron injecting capability when used in combination with an electron injecting layer of LiF, CsI or the like as the inorganic electron injecting layer. Then the material of the cathode need not be restricted to a particular one, and any of conventional metals may be used. For conductivity and ease of handling, a choice is preferably made among Al, Ag, In, Ti, Cu, Au, Mo, W, Pt, Pd and Ni, and mixtures thereof, and especially among Al and Ag. The cathode may have at least a thickness sufficient to provide electrons to the high resistance inorganic electron injecting and transporting layer, typically at least 50 nm, preferably at least 100 nm. The upper limit of thickness is not critical although the thickness is generally from about 50 nm to about 500 nm.

If desired, the following may be used as the cathode or electron injecting electrode. Examples include single metal elements such as K, Cs, Li, Na, Mg, La, Ce, Ca, Sr, Ba, Sn, Zn and Zr, and alloys of two or three of the foregoing elements for improving stability, for example, Ag—Mg alloys (Ag content: 0.1 to 50 at %), Al—Li alloys (Li content: 0.01 to 14 at %), In—Mg alloys (Mg content: 50 to 80 at %), and Al—Ca alloys (Ca content: 0.01 to 20 at %). The cathode or electron injecting electrode may have at least a thickness sufficient for electron injection, typically at least 0.1 nm, preferably at least 0.5 nm, especially at least 1 nm. The upper limit of thickness is not critical although the thickness is generally from about 1 nm to about 500 nm. An auxiliary electrode or protective electrode may be provided on the cathode or electron injecting electrode.

The auxiliary electrode may have at least a sufficient thickness to ensure efficient electron injection and prevent the ingress of moisture, oxygen and organic solvents, preferably a thickness of at least 50 nm, more preferably at least 100 nm, most preferably 100 to 500 nm. A too thin auxiliary electrode layer would exert its effect little, lose a step coverage capability, and provide insufficient connection to a terminal electrode. If too thick, greater stresses are generated in the auxiliary electrode layer, bringing about a detrimental effect such as the accelerated growth rate of dark spots. For the auxiliary electrode, an appropriate material may be chosen in consideration of the material of the electron injecting electrode to be combined therewith. For example, low resistance metals such as aluminum may be used when electron injection efficiency is of importance. Metal compounds such as TiN may be used when sealing is of importance.

The thickness of the cathode or electron injecting electrode and the auxiliary electrode combined is usually about 50 to about 500 nm though it is not critical. It is noted that the combination of the cathode or electron injecting electrode with the auxiliary electrode sometimes has the same meaning as the combination of the electron injecting layer with the cathode.

The material of which the anode or hole injecting electrode is made is preferably a material capable of effectively injecting holes into the inorganic hole injecting and transporting layer or organic hole injecting and transporting layer and having a work function of 4.5 to 5.5 eV. For example, materials based on tin-doped indium oxide (ITO), zinc-doped indium oxide (IZO), indium oxide ($In_2O_3$), tin oxide ($SnO_2$) or zinc oxide (ZnO) are preferable. These oxides may deviate somewhat from their stoichiometry. An appropriate proportion of $SnO_2$ mixed with $In_2O_3$ is 1 to 20% by weight, more preferably 5 to 12% by weight. For IZO, an appropriate proportion of ZnO mixed with $In_2O_3$ is about 12 to 32% by weight.

For adjusting the work function, the anode or hole injecting electrode may contain silicon oxide ($SiO_2$). The preferred content of silicon oxide in ITO is about 0.5 to 10 mol % of $SiO_2$. The ITO having $SiO_2$ added thereto has an increased work function.

The electrode on the light output side should preferably have a light transmittance of at least 50%, more preferably at least 80%, especially at least 90% in the light emission band, typically from 400 to 700 nm, and especially at each light emission. With a lower transmittance, the light emitted by the light emitting layer would be attenuated through the electrode, failing to provide a luminance necessary as a light emitting device. The electrode preferably has a thickness of 50 to 500 nm, especially 50 to 300 nm. Although the upper limit of the electrode thickness is not critical, a too thick electrode would invite a lowering of transmittance and the risk of separation. Too thin an electrode would be less effective and have a problem associated with film strength during fabrication. The relevant electrode is often an anode.

Further preferably, the device is sealed at the top with a shield plate or the like in order to prevent the organic layers and electrodes from deterioration. In order to prevent the ingress of moisture, the shield plate is attached to the underlying through an adhesive resin layer for sealing. The sealing gas is preferably an inert gas such as Ar, He, and $N_2$. The sealing gas should preferably have a moisture content of up to 100 ppm, more preferably up to 10 ppm, especially up to 1 ppm. The lower limit of the moisture content is usually about 0.1 ppm though not critical.

In an embodiment of the invention, the substrate on which the organic EL structure is formed may be selected from amorphous substrates such as glass and quartz and crystalline substrates such as Si, GaAs, ZnSe, ZnS, GaP, and InP. Also acceptable are substrates in which buffer layers of crystalline materials, amorphous materials or metals are formed on such crystalline substrates. Metal substrates including Mo, Al, Pt, Ir, Au and Pd are also useful. Of these, glass substrates are preferred. When the substrate is situated on the light output side, the substrate should preferably have a light transmittance as described above for the electrode.

A plurality of devices in an embodiment of the invention may be arranged on a plane. A color display is arrived at by changing the emission color of such planar arranged devices.

The emission color may also be controlled by providing a color filter film, a color conversion film (containing a fluorescent substance) or a dielectric reflecting film on the substrate.

The organic EL device in an embodiment of the invention is generally of the dc or pulse drive type. It may be of the ac drive type. The applied voltage is generally about 2 to 30 volts.

The organic EL device in an embodiment of the invention may be constructed as a laminate of successively stacked substrate/anode/organic layers (including light emitting layer)/cathode or an inverse laminate. An optimum laminate construction may be determined in accordance with the specifications of an intended display, manufacturing process and the like.

In addition to the display application, the organic EL device of the invention may find use as various optical devices such as optical pickups for use in reading and writing in storage, repeaters in transmission lines for optical communication, and photo couplers.

EXAMPLE

Examples are given below for illustrating an embodiment of the invention. Comparative Examples are also given below.

First of all, the structure of main compounds used herein is shown below. Note that n and m in structural formulae represent a degree of polymerization.

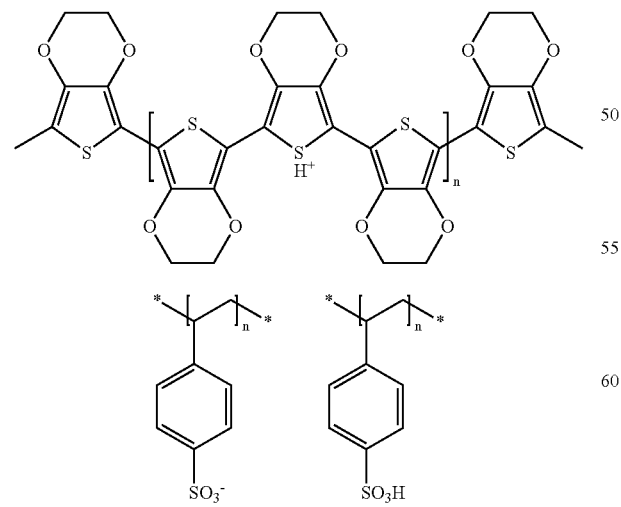

polyethylenedioxythiophene/polystyrene sulfonic acid (PEDOT/PSS)

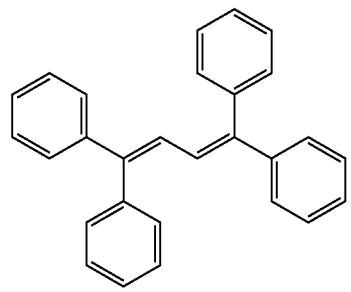

tetraphenylbutadiene

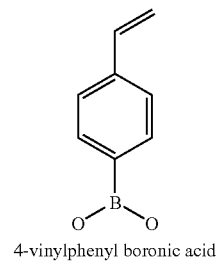

4-vinylphenyl boronic acid

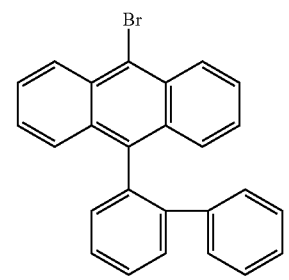

9-biphenyl-2-yl-10-bromoanthracene

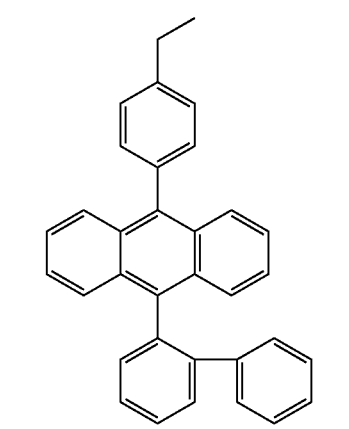

9-biphenyl-2-yl-10-(4-vinylphenyl)anthracene

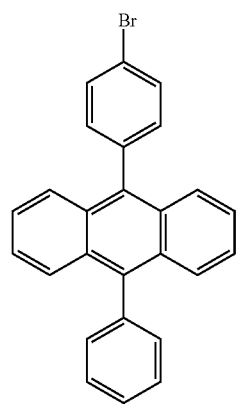
9-(4-bromophenyl)-10-phenylanthracene
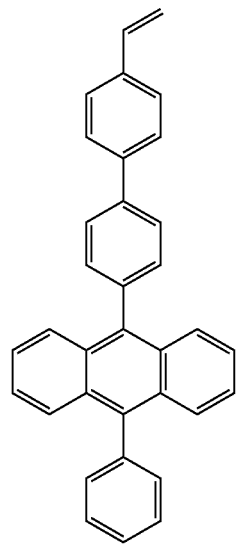
9-phenyl-10-(4'-vinylbipheny-4-yl) anthracene
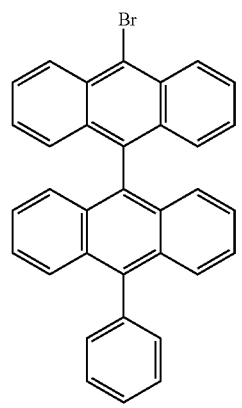
10-bromo-10'-phenyl-[9,9'] bianthracenyl
(10-Bromo-10'-phenyl-[9,9'] bianthracenyl)
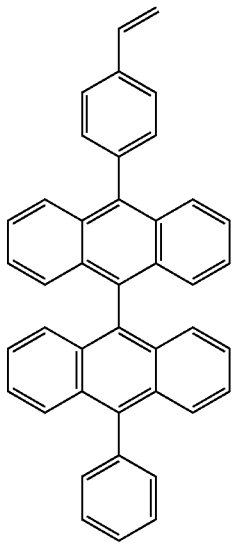
10-phenyl-10'-(4-vinylphenyl)-[9,9'] bianthracenyl
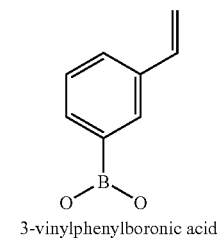
3-vinylphenylboronic acid
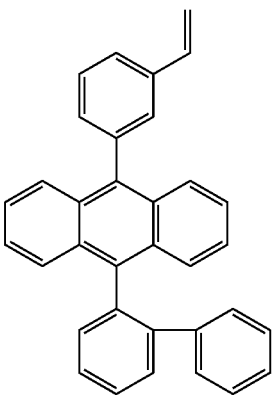
9-biphenyl-2-yl-10-(3-vinylphenyl) anthracene
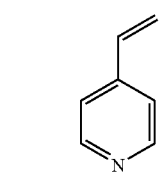
4-vinylpyridine -continued

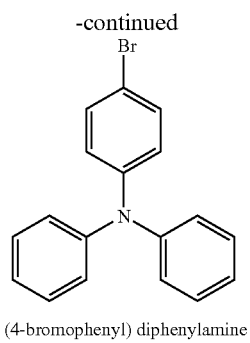

(4-bromophenyl) diphenylamine

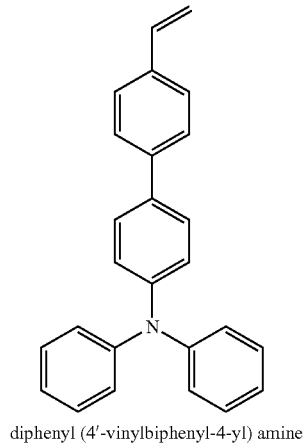

diphenyl (4'-vinylbiphenyl-4-yl) amine

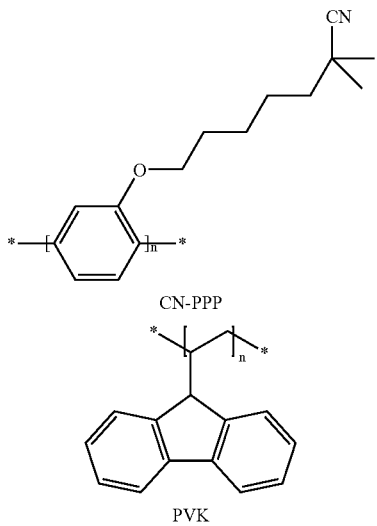

CN-PPP

PVK

Example 1

Under nitrogen, 8.2 g (20 mmol) of 9-biphenyl-2-yl-10-bromoanthracene, 3.3 g (22 mmol) of 4-vinylphenylboronic acid and 0.6 g of tetrakistriphenylphosphinopalladium (Pd(pph$_3$)$_4$) were dissolved in a solvent mixture of 40 ml toluene and 10 ml ethanol. Next, 20 ml of an aqueous solution of 2 mol/l sodium carbonate was added to the solution, which was allowed to react at 90° C. for 24 hours. Extraction with ether and purification by column chromatography gave 4.5 g of a white solid, 9-biphenyl-2-yl-10-(4-vinylphenyl)anthracene. The yield was 52%.

Next, 2 g of 9-biphenyl-2-yl-10-(4-vinylphenyl)anthracene and 20 mg of benzoylperoxide (BPO) as a radical polymerization initiator were dissolved in 15 ml of tetrahydrofuran (THF). Under nitrogen, polymerization reaction was performed at 70° C. for 48 hours. After the completion of reaction, reprecipitation was carried out three times using THF as the good solvent and methanol as the poor solvent. Then reprecipitation was similarly carried out three times using ethyl acetate instead as the poor solvent, leaving 1.08 g of a polymer. The resulting polymer had a weight average molecular weight of 16,000.

Next, a 2.0 wt % toluene solution of this polymer was prepared. Then tetraphenylbutadiene as a dopant was added to the solution in an amount of 2% by weight based on the monomer units in the polymer, to form a light emitting layer coating solution. An organic EL device was fabricated by the following procedure.

On an ITO substrate, polyethylenedioxythiophene/polystyrene sulfonic acid (PEDOT/PSS) was coated to a thickness of 500 Å (50 nm) by a spin coating technique. After vacuum drying at 80° C. for one hour, the light emitting layer coating solution prepared above was coated to form a light emitting layer of 1,000 Å (100 nm) thick. After similar vacuum drying at 80° C. for one hour, LiF and Al were vacuum evaporated to a thickness of 6 Å (0.6 nm) and 2,500 Å (250 nm), respectively, to form a cathode. Sealing completed an organic EL device. This device produced blue light emission from tetraphenylbutadiene and showed a current efficiency of 3.6 cd/A upon constant current driving at 10 mA/cm$^2$. A luminance half-life test was carried out at 10 mA/cm$^2$, finding a lifetime of 650 hours.

Example 2

A run was carried out as in Example 1 aside from using 9-(4-bromophenyl)-10-phenylanthracene instead of 9-biphenyl-2-yl-10-bromoanthracene. There was obtaine 9-phenyl-10-(4'-vinylbiphenyl-4-yl)anthracene in a yield of 62%. From this monomer, a polymer was prepared in a yield of 76% and had a weight average molecular weight of 12,000.

An organic EL device was fabricated as in Example 1. This device produced blue light emission from tetraphenylbutadiene and showed a current efficiency of 3.0 cd/A upon constant current driving at 10 mA/cm$^2$. The luminance half-life at 10 mA/cm$^2$ was 400 hours.

Example 3

A run was carried out as in Example 1 aside from using 10'-bromo-10-phenyl-[9,9']bianthracenyl instead of 9-biphenyl-2-yl-10-bromoanthracene. There was obtained 10-phenyl-10'-(4-vinylphenyl)-[9,9']bianthracenyl in a yield of 58%. From this monomer, a polymer was prepared in a yield of 60% and had a weight average molecular weight of 11,000.

An organic EL device was fabricated as in Example 1. This device produced blue light emission from tetraphenylbutadiene and showed a current efficiency of 3.2 cd/A upon constant current driving at 10 mA/cm$^2$. The luminance half-life at 10 mA/cm$^2$ was 600 hours.

Example 4

A run was carried out as in Example 1 aside from using 9-biphenyl-2-yl-10-bromoanthracene and 3-vinylphenylboronic acid. There was obtained 9-biphenyl-2-yl-10-(3-vinylphenyl)anthracene in a yield of 63%. From this monomer, a polymer was prepared in a yield of 78% and had a weight average molecular weight of 21,000. An organic EL device was fabricated as in Example 1. This device produced blue light emission from tetraphenylbutadiene and showed a current efficiency of 4.0 cd/A upon constant current driving at 10 mA/cm². The luminance half-life at 10 mA/cm² was 580 hours.

Example 5

Radical polymerization reaction was carried out as in Example 1 using a mixture of 9-biphenyl-2-yl-10-(4vinylphenyl)anthracene and 4-vinylpyridine in a molar ratio of 85:15. There was obtained a copolymer (weight average molecular weight 15,000). The yield was 66%.

An organic EL device was fabricated as in Example 1. This device produced blue light emission from tetraphenylbutadiene and showed a current efficiency of 3.5 cd/A upon constant current driving at 10 mA/cm². The luminance half-life 10 mA/cm² was 800 hours.

Example 6

A run was carried out as in Example 1 aside from using 9-bromo-10-(4-octylphenyl)phenylanthracene instead of 9-biphenyl-2-yl-10-bromoanthracene. There was obtained 9(4-octylphenyl)-10-(4-vinylphenyl)anthracene in a yield of 72%. From this monomer, a polymer was prepared in a yield of 76% and had a weight average molecular weight of 18,000.

An organic EL device was fabricated as in Example 1. This device produced blue light emission from tetraphenylbutadiene and showed a current efficiency of 2.30 cd/A upon constant current driving at 10 mA/cm². The luminance half-life at 10 mA/cm² was 500 hours.

In coating the light emitting layer of the organic EL device, the above polymer was readily dissolved, the coating operation was easy, and drying was quick.

Comparative Example 1

An organic EL device was fabricated as in Example 1 aside from using polyvinyl carbazole (PVK, weight average molecular weight 10,000–1,000,000) as the polymer. This device produced blue light emission from tetraphenylbutadiene and showed a low current efficiency of 1.6 cd/A upon constant current driving at 10 mA/cm². The luminance half-life at 10 mA/cm² was 4 hours.

Comparative Example 2

A run was carried out as in Example 1 aside from using (4-bromophenyl)diphenylamine instead of 9-biphenyl-2-yl-10-bromoanthracene. There was obtained diphenyl(4'-vinylbiphenyl-4-yl)amine in a yield of 66%. From this monomer, a polymer was prepared in a yield of 70% and had a weight average molecular weight of 10,000. An organic EL device was fabricated as in Example 1. This device produced blue light emission from tetraphenylbutadiene and showed a current efficiency of 2.1 cd/A upon constant current driving at 10 mA/cm². The luminance half-life at 10 mA/cm² was only 15 minutes.

Comparative Example 3

An organic EL device was fabricated using CN-PPP (weight average molecular weight 10,000), π-conjugated polymer capable of generating blue fluorescence. After PEDOT/PSS was coated and dried to a thickness of 500 Å (50 nm) as in Example 1, a light emitting layer of 1,000 Å (100 nm) was laid thereon using a xylene solution of 1.5 wt % CNPPP. After similar vacuum drying at 80° C. for one hour, Ca and Al were vacuum evaporated to a thickness of 60 Å (6 nm) and 2,500 Å (250 nm), respectively, to form a cathode. Sealing completed an organic EL device. Upon constant current driving at 10 mA/cm², no light emission from this device was observed.

Comparative Example 4

A device was fabricated as in Comparative Example 3 except that a solution to which tetraphenylbutadiene was added as a dopant in an amount of 2% by weight based on the CN-PPP solids was used in the coating of the light emitting layer. This device produced blue light emission, but the current efficiency upon constant current driving at 10 mA/cm² was less than 0.1 cd/A.

Comparative Example 5

A run was carried out as in Example 1 aside from using 9-bromoanthracene instead of 9-biphenyl-2-yl-10-bromoanthracene. There was obtained 9-(4-vinylphenyl)-anthracene in a yield of 61%. From this monomer, a polymer was prepared in a yield of 58% and had a weight average molecular weight of 11,000. An organic EL device was fabricated as in Example 1. This device produced blue light emission from tetraphenylbutadiene, but the current efficiency upon constant current driving at 10 mA/cm² was only 0.8 cd/A. In a luminance half-life test at 10 mA/cm², the device burned out within 30 seconds.

What is claimed is:

1. An organic EL device comprising an organic layer comprising a vinyl polymer obtained from a vinyl monomer having a group including the structure of formula (1):

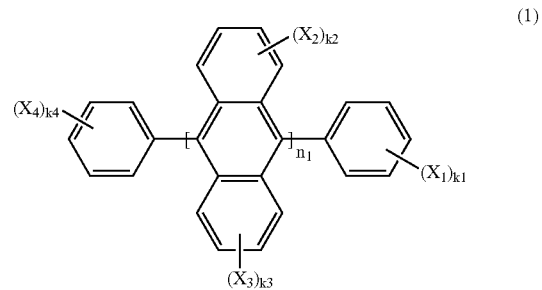

wherein $n_1$ is an integer of 1 to 3, each of $X_1$, $X_2$, $X_3$ and $X_4$ is a substituent group, $k_1$ and $k_4$ are integers of 0 to 5 when $n_1$ is an integer of 2 or 3, when $n_1$ is 1 $k_1$ is an integer of 1 to 5 and $k_4$ is an integer of 0 to 5, and $k_2$ and $k_3$ are integers of 0 to 4.

2. The organic EL device of claim 1 wherein in formula (1), at least one of $X_1$, $X_2$, $X_3$, and $X_4$ is a substituent group having an alkyl group of 3 to 20 carbon atoms in total, and at least one substituent group having an alkyl group of 3 to 20 carbon atoms in total is present.

3. The organic EL device of claim 1 wherein said vinyl monomer has formula (2):

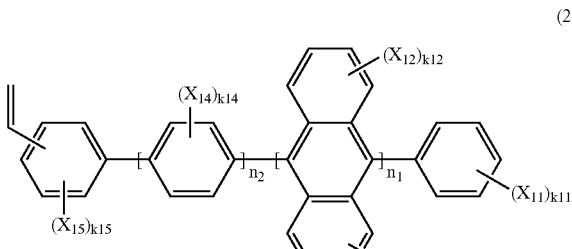
(2)

wherein $n_1$ is an integer of 1 to 3, $n_2$ is 0 or 1, each of $X_{11}$, $X_{12}$, $X_{13}$, $X_{14}$ and $X_{15}$ is an alkyl group, alkoxy group, aryl group, aryloxy group, heterocyclic group, halogen atom, cyano group, hydroxyl group or amino group, $k_{11}$ is an integer of 0 to 5 when $n_1$ is an integer of 2 or 3, when $n_1$ is 1 and $n_2$ is 1 $k_{11}$ is an integer of 0 to 5, when $n_1$ is 1 and $n_2$ is 0 $k_{11}$ is an integer of 1 to 5, and each of $k_{12}$, $k_{13}$, $k_{14}$ and $k_{15}$ is an integer of 0 to 4.

4. The organic EL device of claim 3 wherein in formula (2), at least one of $X_{11}$, $X_{12}$, $X_{13}$, $X_{14}$ and $X_{15}$ is a substituent group having an alkyl group of 3 to 20 carbon atoms in total, and at least one substituent group having an alkyl group of 3 to 20 carbon atoms in total is present.

5. The organic EL device of claim 1 wherein said vinyl polymer is a copolymer obtained from said vinyl monomer and another vinyl monomer.

6. The organic EL device of claim 3 wherein said vinyl monomer has been synthesized according to the reaction scheme represented by formula

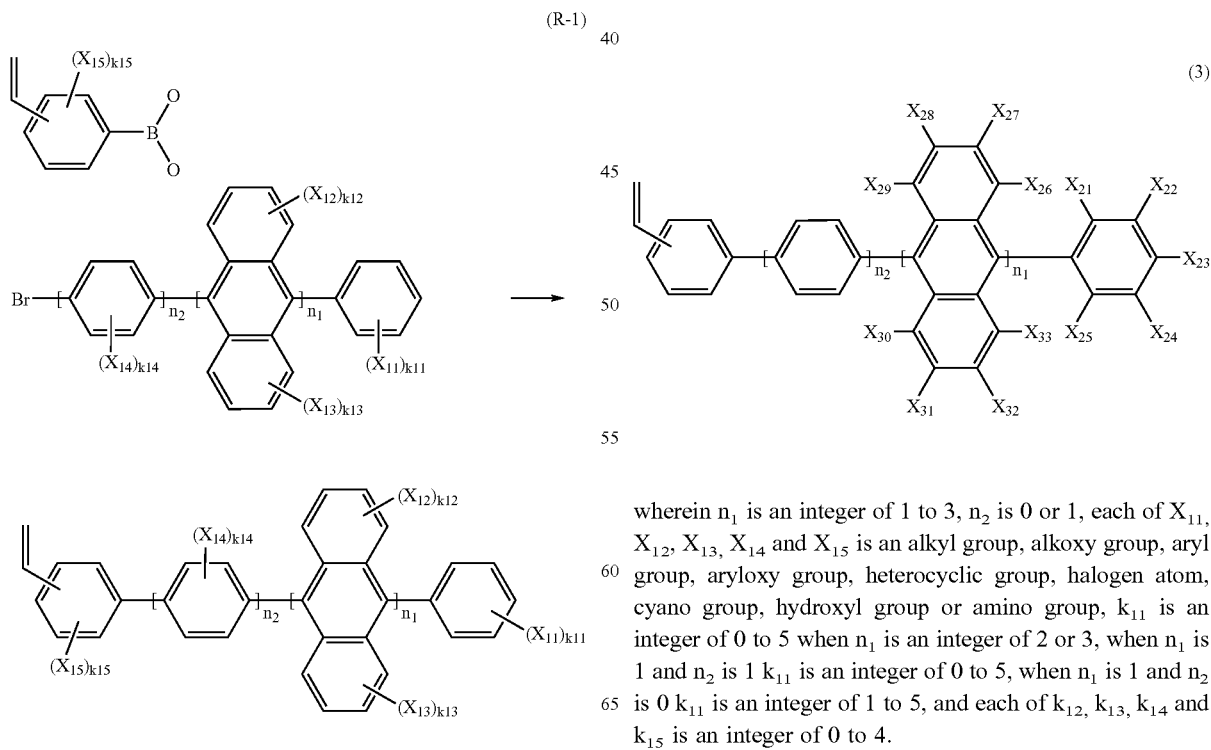
(R-1)

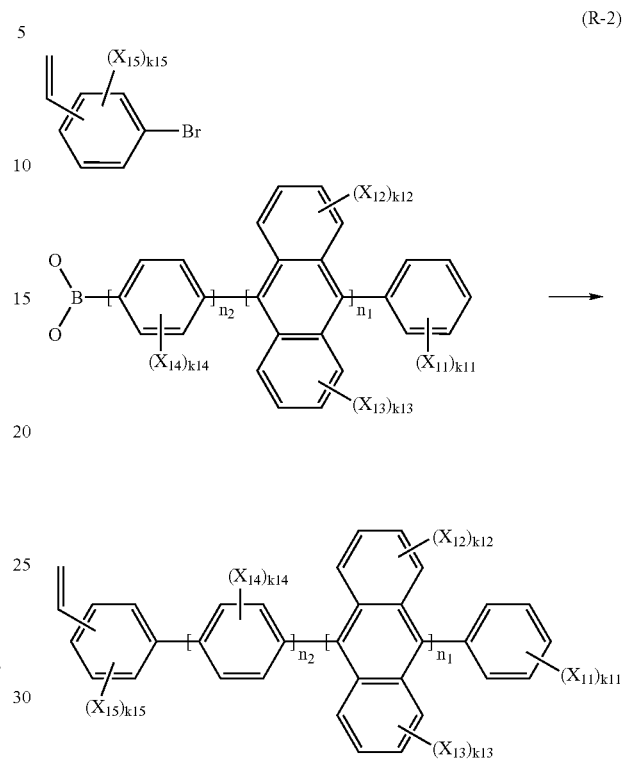
(R-2)

(3)

wherein $n_1$ is an integer of 1 to 3, $n_2$ is 0 or 1, each of $X_{11}$, $X_{12}$, $X_{13}$, $X_{14}$ and $X_{15}$ is an alkyl group, alkoxy group, aryl group, aryloxy group, heterocyclic group, halogen atom, cyano group, hydroxyl group or amino group, $k_{11}$ is an integer of 0 to 5 when $n_1$ is an integer of 2 or 3, when $n_1$ is 1 and $n_2$ is 1 $k_{11}$ is an integer of 0 to 5, when $n_1$ is 1 and $n_2$ is 0 $k_{11}$ is an integer of 1 to 5, and each of $k_{12}$, $k_{13}$, $k_{14}$ and $k_{15}$ is an integer of 0 to 4.

7. The organic EL device of claim 3 wherein said vinyl monomer has formula (3):

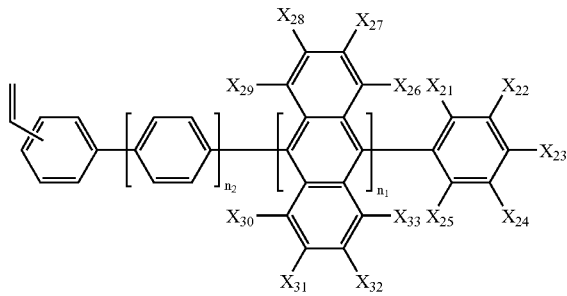
(3)

wherein $n_1$ is an integer of 1 to 3, $n_2$ is 0 or 1, and each of $X_{21}$ to $X_{33}$ is a hydrogen atom, alkyl group, alkoxy group or aryl group.

8. The organic EL device of claim 7 wherein in formula (3), at least one of $X_{21}$ to $X_{33}$ is a substituent group having an alkyl group of 3 to 20 carbon atoms in total, and at least one substituent group having an alkyl group of 3 to 20 carbon atoms in total is present.

9. The organic EL device of claim 1 wherein said organic layer containing a vinyl polymer obtained from a vinyl monomer is a light emitting layer.

10. The organic EL device of claim 9 wherein said light emitting layer further contains a dopant so that it emits blue light.

11. An organic EL device comprising an organic layer comprising a vinyl polymer obtained from a vinyl monomer having a group including the structure of formula (1):

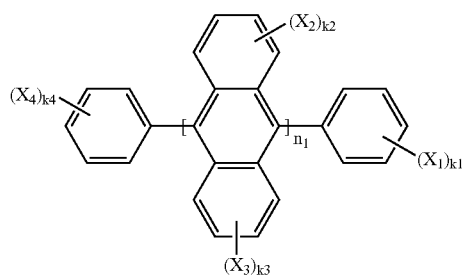
(1)

wherein $n_1$ is an integer of 2 or 3, each of $X_1$, $X_2$, $X_3$ and $X_4$ is a substituent group, $k_1$ and $k_4$ are integers of 0 to 5, and $k_2$ and $k_3$ are integers of 0 to 4.

12. An organic EL device comprising an organic layer comprising a vinyl polymer obtained from a vinyl monomer having a group including the structure of formula (1):

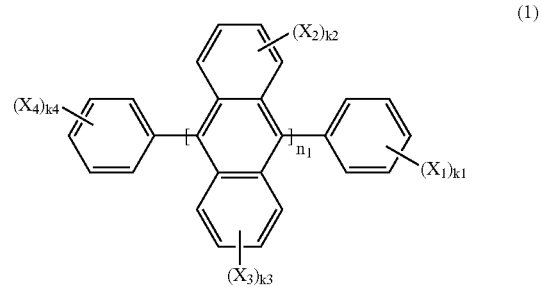
(1)

wherein $n_1$ is an integer of 1 to 3, each of $X_1$, $X_2$, $X_3$ and $X_4$ is a substituent group, $k_1$ and $k_4$ are integers of 1 to 5, and $k_2$ and $k_3$ are integers of 0 to 4.

13. The organic EL device of claim 12 wherein said vinyl monomer has formula (2):

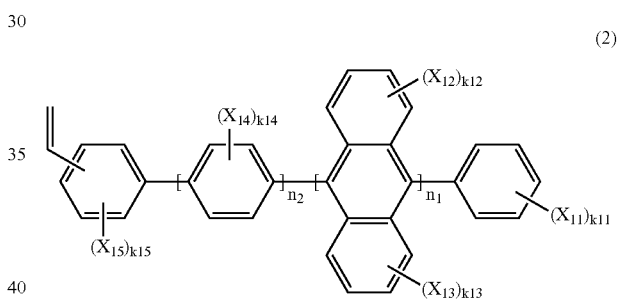
(2)

wherein $n_1$ is an integer of 1 to 3, $n_2$ is 0 or 1, each of $X_{11}$, $X_{12}$, $X_{13}$, $X_{14}$ and $X_{15}$ is an alkyl group, alkoxy group, aryl group, aryloxy group, heterocyclic group, halogen atom, cyano group, hydroxyl group or amino group, $k_{11}$ is an integer of 1 to 5, and each of $X_{12}$, $X_{13}$, and $X_{14}$ is an integer of 0 to 4 and $k_{15}$ is an integer of 1 to 5.

* * * * *